United States Patent [19]
Noto

[11] Patent Number: 5,342,992
[45] Date of Patent: Aug. 30, 1994

[54] PIN GRID ARRAY PACKAGE WITH PIN THROUGH PLATING

[75] Inventor: Kazuyoshi Noto, San Diego, Calif.

[73] Assignee: Kyocera Internatinoal, Inc., San Diego, Calif.

[21] Appl. No.: 775,230

[22] Filed: Oct. 11, 1991

[51] Int. Cl.$^5$ .......................................... H01L 23/02
[52] U.S. Cl. ............................. 174/52.4; 118/620; 361/736; 361/760; 174/260
[58] Field of Search ........... 257/690, 692, 693, 694, 257/695, 697, 698; 361/400, 395, 403, 404, 405, 406, 407, 408, 409, 413, 414, 415, 416, 417, 418, 419, 420; 174/52.2, 52.3, 52.4, 260; 29/884, 885; 118/620, 624–625

[56] References Cited
U.S. PATENT DOCUMENTS 3,487,350 12/1969 Hammell ..................... 257/693
5,061,989 10/1991 Yen et al. ..................... 257/692

FOREIGN PATENT DOCUMENTS 3268476 11/1991 Japan .

Primary Examiner—Leo P. Picard
Assistant Examiner—Bot Ledynh
Attorney, Agent, or Firm—Spensley Horn Jubas & Lubitz

[57] ABSTRACT

The present invention provides a method and an apparatus for manufacturing a pin grid array package assembly. According to this invention, the leads of the pin grid array package assembly are removably inserted into an electrically conductive plate containing detachable pin-clasp contacts. The plate clamps onto the ends of the leads, thereby forming a common electrical contact for the electroplating process. After the electroplating process has been completed and prior to shipping the package, the plate is detached without requiring the step of cutting ends of the leads from the plate.

6 Claims, 3 Drawing Sheets

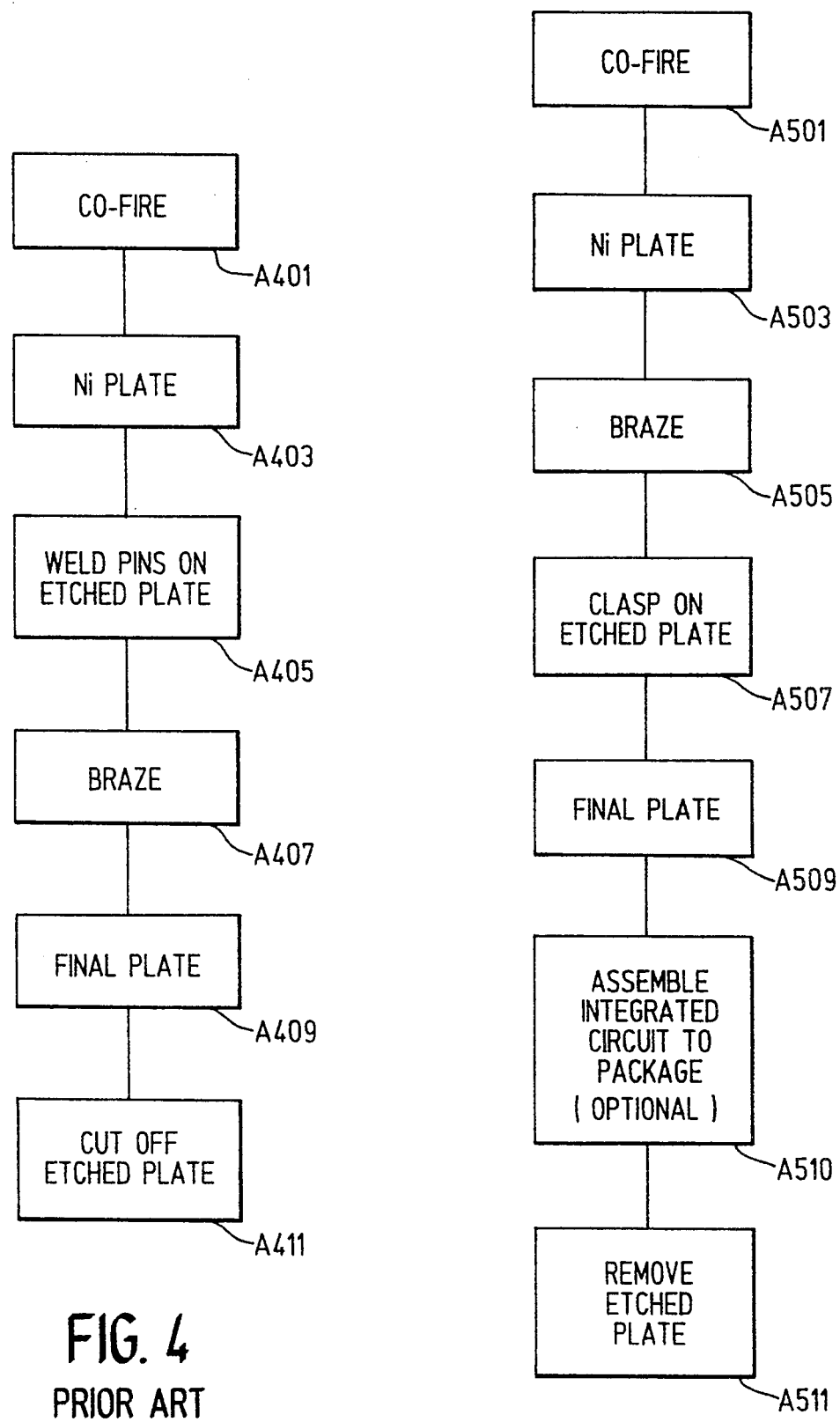

PIN GRID ARRAY PACKAGE WITH PIN THROUGH PLATING

BACKGROUND OF THE INVENTION

1. Field of the Invention

This invention relates generally to an apparatus and a method for manufacturing multi-layer packages for electronic devices. More specifically, the invention relates to a device and an assembly method for fabricating pin grid array assembly packages, using a removable plate.

2. Description of Related Art

A widely-utilized technique for manufacturing packages for electronic devices involves the use of a pin grid array. The array includes a plurality of conductive pins which are used to form the leads for the electronic device package. Electroplating is employed to provide leads with enhanced solderability, conductivity, and/or immunity to corrosion. In the prior art, a conductive plate is welded to the pin grid array to electrically short out leads during the electroplating process. These leads are held at substantially the same electrical potential to ensure a relatively uniform coating of metal over each lead. The pin grid array is configured to provide at least one ground lead such that an electrical potential may be applied between the conductive plate and a ground terminal.

A drawback of prior-art grid array manufacturing techniques is that the pins of the array must be welded to an etched plate prior to electroplating. However, after electroplating is completed, the plate must then be removed by shearing off the ends of the pins near the plate. This step is costly and time-consuming. Furthermore, the plates cannot be re-used to fabricate additional integrated circuits, and are usually discarded.

An example of a prior-art method for electroplating integrated circuit package leads is described in U.S. Pat. No. 4,706,382. A tie bar is utilized, comprised of a metal strip which is resistance-welded near the ends of the leads. This configuration provides electrical continuity to the leads during plating. The tie bar itself also serves as a stabilizer for accurate alignment of the leads inside the pin grid array package. Therefore, the leads may be accurately aligned, welded to the tie bar, and then brazed into the pin grid array package. Subsequently, the tie bar must be removed by cutting or shearing the leads to a uniform length just above the tie bar. However, welding the tie bar and then shearing the tie bar from the leads adds additional steps to the manufacturing process which are both time-consuming and costly. Furthermore, each etched plate is discarded after removal from the pin grid array.

Accordingly, it is an object of the invention to provide an improved assembly for packaging electronic devices such as integrated circuits. A pin grid array package is employed, but the steps of welding or brazing an etched plate to the pin grid array and shearing the pins to remove the etched plate, are not required.

The etched plate can also be used as a ground to eliminate problems caused by static electricity during the integrated circuit assembly process. Unlike the conductive plates of the prior-art, the etched plate of the invention can be removed easily when desired.

SUMMARY OF THE INVENTION

The present invention provides an improved technique for manufacturing packages for electronic devices such as integrated circuits. The packages include a plurality of electrically conductive pins which may be connected, for example, to integrated circuit components. These pins are arranged to form a pin grid array. Prior to electroplating the pins, a detachable, electrically-conductive plate is removably attached to the pins of the array so that the pins will be at substantially the same electrical potential.

After electroplating is completed, the plate of the present invention is easily removed from the pin grid array. The plate consists of one or more tie-bar structures having pin-clasping contacts. The pin-clasping contacts eliminate the need to weld the plate to the pin grid array. These contacts pinch or squeeze the pins during electroplating to provide a mechanically detachable, friction-fit connection having electrical continuity. The contacts are easily removed from the pins after electroplating by pulling the plate away from the electronic device package. In this manner, the plate may be re-used to electroplate the leads of additional electronic device packages.

The details of the preferred embodiment of the present invention are set forth in the accompanying drawings and the description below. Once the details of the invention are known, numerous additions and changes will become obvious to one skilled in the art.

BRIEF DESCRIPTION OF THE DRAWINGS

FIG. 4 is a flow diagram illustrating a prior-art method for electroplating the pin grid array.

FIG. 5 is a flow diagram illustrating a method for electroplating the pin grid array according to the present invention.

Like reference numbers and designations in the drawings refer to like elements.

DESCRIPTION OF THE PREFERRED EMBODIMENT

Throughout this description, the preferred embodiment and the examples shown should be considered as illustrative examples, rather than as limitations on the present invention.

Figure 1:
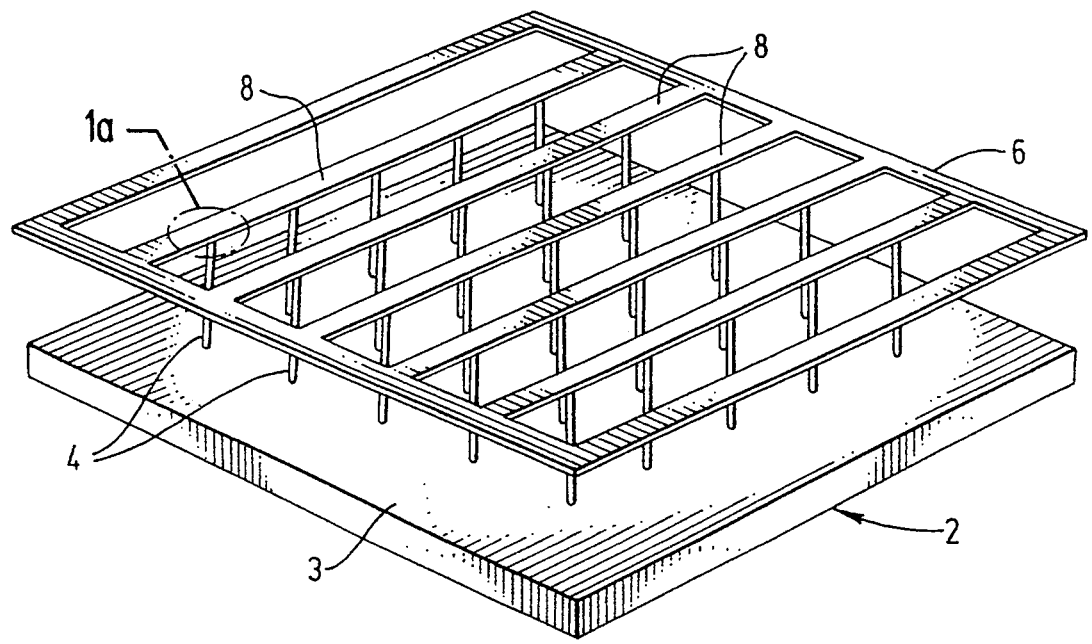
FIG. 1 is a perspective view of a prior art device for electroplating electronic device packages which employs a pin grid array and a plate welded onto the pins.

Referring now to FIG. 1, a perspective view of a prior art pin grid array 2 is shown. The pin grid array 2 consists of a pin grid array package 3 which is used to package electronic devices such as integrated circuits, and a multiplicity of leads 4 which provide leads for the pin grid array package 3. Plating of the pin grid array package and leads is generally performed before an electronic device is placed in the pin grid array package 3.

Figure 1A:
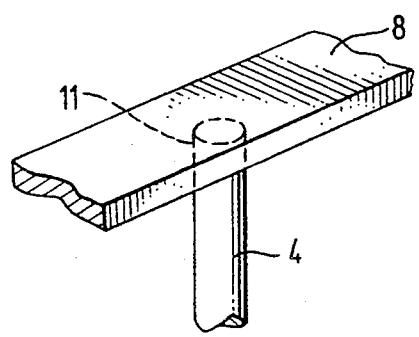
FIG. 1a is an enlarged view of the weld between the plate and the pins of FIG. 1.

As shown in FIG. 4, the prior art process of plating the leads 4 and the pin grid array package 3, initially consists of co-firing the pin grid array package 3 at block A401. Next, at block A403, the entire package 3 and the leads 4 are nickel-plated. At block A405, an etched plate 6 is welded on top of the leads 4 in order to form a common electrical connection. The making of such etched plates 6 is well known. The common electrical connection of the leads 4 and the etched plate 6 facilitate the electroplating process. FIG. 1a shows that the distal portion 11 of the lead 4 is welded to a tie bar 8 of the etched plate, thereby forming a common electrical connection. After a brazing step at block A407 to attach the leads 4 to the pin grid array package 3, the pin grid array packages 3 and leads 4 undergo final plating at block A409. Prior to shipping the device 2 and subsequent to the electroplating process, at block A411, the etched plate is sheared from the distal portion 11 of the leads 4 at their contact point with the tie bar 8 of the etched plate 6.

Figure 2:
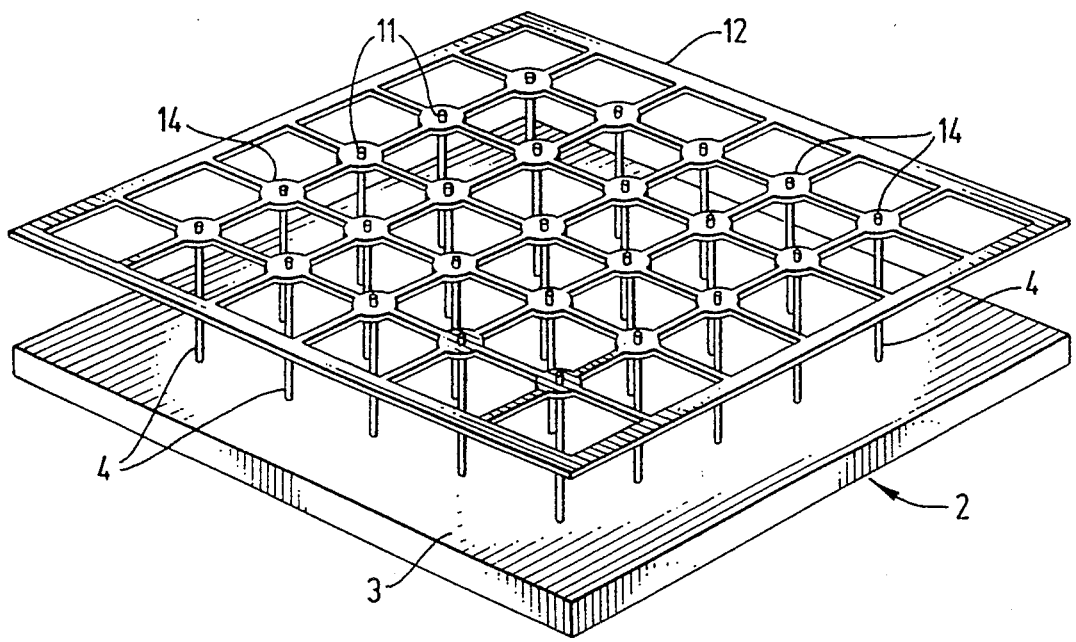
FIG. 2 is a perspective view of the present invention showing the plate with pin-clasps.
Figure 3:
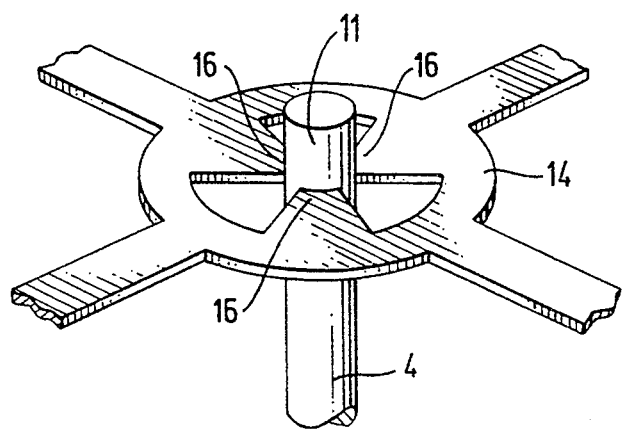
FIG. 3 is an enlarged view of a pin held in place with the plate shown in FIG. 2.

The present invention as shown in FIG. 2 eliminates the step of having to weld the etched plate 6 to the leads (FIG. 4, block A405), and thus obviates the need to shear off the etched plate 6 prior to shipping (FIG. 4, block A411). In accordance with the preferred embodiment, a detachable plate 12 is provided, which includes pin-clasp contacts 14. The pin-clasp contacts 14 are press fitted onto the distal portion 11 of the leads 4 of pin grid array 2 to make a common electrical connection. Each pin-clasp contact 14 is commonly connected to other pin-clasp contacts 14 and then to the outer edge of the plate 12. Referring to FIG. 3, the pin-clasp contact 14 may be configured as a single contact prong or as a plurality of contact prongs 16. In this fashion, the distal portion 11 of leads 4 may be friction-fitted into the pin-clasp contact 14. In the preferred embodiment the plate 12 is formed by etching, in accordance with well-known techniques.

FIG. 5 illustrates a method of fabricating the pin grid array package 2 using the etched plate 12 shown in FIG. 2. At block A501, the package is co-fired, and then nickel-plated at block A503. A brazing step is implemented at block A505 to attach the leads 4 to the pin grid array package 2 followed by the step of friction-fitting the etched plate 12 over the pins 4 on the pin grid array package 2 at block A507. Final plating is performed at block A509, followed by optional assembly of the integrated circuit to the pin grid array package 2 at block A510. At block A511, the etched plate is removed from the leads 4.

After the electroplating process is completed and prior to shipping, removal of the etched plate 12 from the pin grid array 2 is facilitated due to the construction and design of the etched plate 12. That is, since the etched plate 12 is not welded to the leads 4, the step of shearing the distal portion 11 from the leads 4 is not required. Rather, the etched plate 12 slides off of the leads 4 prior to the shipping. The etched plate 12 is easily detached due to the configuration of the pin-clasp contacts 14, which are only pinched or friction-fitted against the leads 4.

In comparison to FIG. 4, the method of the present invention as shown in FIG. 5 eliminates the steps of welding and shearing the etched plate 6 from the lead 4, thereby reducing the time for manufacturing, and also reducing the cost of producing a new etched plate for every pin grid array. That is, in the case of welding, each part (i.e., each pin grid array), requires its own etched plate. After the electroplating process is completed, the etched plate is usually discarded. In contrast, the etched plate 12 with pin-clasp contacts 14 may be utilized more than once, thus saving cost and time.

A number of embodiments of the present invention have been described. Nevertheless, it will be understood that various modifications may be made without departing from the spirit and scope of the invention. For example, different configurations of pin-clasp contacts may be used that apply compressive forces to the leads such that good electrical contact is established. Further, the plate 12 may be made by methods other than etching, such as stamping. Accordingly, it is to be understood that the invention is not to be limited by the specific illustrated embodiment, but only by the scope of the appended claims.

I claim:
1. A pin grid array package assembly comprising:
    a. a pin grid array package for housing an electronic device therein;
    b. a plurality of conductive leads, each lead having a first end disposed within the pin grid array package and a second end disposed outside of the pin grid array package; and
    c. an electrically conductive plate detachably mounted near the second ends of the leads wherein the plate further comprises a plurality of pin-clasp contacts, each for friction-fitting around the second end of a corresponding one of the leads, thereby providing electrical continuity to each lead.

2. A pin grid array package assembly according to claim 1, wherein the pin-clasp contact comprises a plurality of contact prongs formed in an approximately circular pattern, each prong facing in toward the center of the pattern into which the second end of the corresponding lead is inserted and engaged by the contact prongs.

3. A pin grid array package assembly according to claim 1, wherein the pin-clasp contact comprises a hole for receiving the second end of a corresponding lead and a single contact prong within the hole for engaging a portion of the lead near the second end.

4. A pin grid array package assembly according to claim 1, wherein the plate is formed by an etching process.

5. An apparatus for maintaining substantially all of the pins of the packages for electronic devices at essentially the same electrical potential, the pins of the packages being, electrically-conductive and arranged to form a pin grid array; the apparatus comprising a detachable, electrically-conductive removable plate for detachable receiving the pins of the pin grid array, the plate including a plurality of pin-clasping contacts which each apply compressive force to a pin inserted therein.

6. An apparatus according to claim 5, wherein the plate is formed by an etching process.

* * * * *